US010096727B2

(12) United States Patent
Jung et al.

(10) Patent No.: US 10,096,727 B2
(45) Date of Patent: Oct. 9, 2018

(54) METHOD OF MANUFACTURING FINGER ELECTRODE FOR SOLAR CELL

(71) Applicant: SAMSUNG SDI CO., LTD., Yongin-si, Gyeonggi-do (KR)

(72) Inventors: Seok Hyun Jung, Suwon-si (KR); Min Jae Kim, Suwon-si (KR); Sang Hyun Yang, Suwon-si (KR); Hyun Jin Koo, Suwon-si (KR); Dong Suk Kim, Suwon-si (KR); Ju Hee Kim, Suwon-si (KR); Young Ki Park, Suwon-si (KR); Min Young Lee, Suwon-si (KR)

(73) Assignee: Samsung SDI Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 15/632,437

(22) Filed: Jun. 26, 2017

(65) Prior Publication Data
US 2018/0122967 A1    May 3, 2018

(30) Foreign Application Priority Data

Oct. 28, 2016  (KR) .......................... 10-2016-0142436

(51) Int. Cl.
*H01L 21/00* (2006.01)
*H01L 31/0224* (2006.01)

(52) U.S. Cl.
CPC .......................... *H01L 31/022433* (2013.01)

(58) Field of Classification Search
CPC ........... H01L 31/022433; H01L 31/042; H01L 25/045; H01L 27/1422; H01L 27/1423

USPC .......................................................... 438/98
See application file for complete search history.

(56) References Cited

U.S. PATENT DOCUMENTS

| 2011/0095240 | A1* | 4/2011 | Nakamura | C03C 3/062 |
| | | | | 252/514 |
| 2013/0021763 | A1* | 1/2013 | Li | B23K 1/0016 |
| | | | | 361/760 |
| 2015/0333197 | A1* | 11/2015 | Takeda | H01B 1/22 |
| | | | | 136/256 |

FOREIGN PATENT DOCUMENTS

| JP | 4255248 B2 | 4/2009 |
| TW | 201418041 A | 5/2014 |
| TW | 201515019 A | 4/2015 |

OTHER PUBLICATIONS

Taiwanese Office Action dated May 22, 2018.

* cited by examiner

*Primary Examiner* — Elias M Ullah
(74) *Attorney, Agent, or Firm* — Lee & Morse, P.C.

(57) ABSTRACT

A method of manufacturing a finger electrode for a solar cell, the method including printing a conductive paste on a front surface of a substrate using a printing mask having an opening rate of about 65% or more and baking the printed conductive paste. The conductive paste includes a conductive powder, a glass frit including about 30 mol % to about 60 mol % of tellurium oxide and about 0.1 mol % to about 10 mol % of tungsten oxide, and an organic vehicle.

9 Claims, 1 Drawing Sheet longitudinal direction

METHOD OF MANUFACTURING FINGER ELECTRODE FOR SOLAR CELL

CROSS-REFERENCE TO RELATED APPLICATION

Korean Patent Application No. 10-2016-0142436, filed on Oct. 28, 2016, in the Korean Intellectual Property Office, and entitled: "Method of Manufacturing Finger Electrode for Solar Cell," is incorporated by reference herein in its entirety.

BACKGROUND

1. Field

Embodiments relate to a method of manufacturing a finger electrode for solar cells. More particularly, embodiments relate to a method of manufacturing a finger electrode for solar cells using a printing mask having a high opening rate of about 65% or more.

2. Description of the Related Art

Solar cells generate electricity using the photovoltaic effect of a p-n junction which converts photons of sunlight into electricity. In the solar cell, front and rear electrodes are respectively formed on upper and lower surfaces of a semiconductor wafer or substrate with the p-n junction therebetween. Then, the photovoltaic effect at the p-n junction is induced by sunlight entering the semiconductor wafer and electrons generated by the photovoltaic effect at the p-n junction provide electric current through the electrodes.

Such a solar cell electrode is generally manufactured by placing a printing mask having openings for formation of electrodes on a semiconductor substrate, placing a conductive paste on the printing mask, and printing the conductive paste on the semiconductor substrate through the openings of the printing mask in the form of electrodes, followed by baking the printed conductive paste.

FIG. 1 shows an image of a general printing mask used in formation of a solar cell electrode. Referring to FIG. 1, such a general printing mask is manufactured by applying a photosensitive resin 14 to a mesh 12 arranged obliquely with respect to the longitudinal direction of the printing mask and selectively removing a portion of the photosensitive resin at which an electrode will be printed using a photoresist process, thereby forming an electrode printing portion 16. Such a general printing mask for formation of solar cell electrodes has an opening rate of 45% to 60%, wherein the opening rate refers to the proportion of the area occupied by a mesh-free portion to the total area of the electrode printing portion.

A finger electrode formed on a front surface of a solar cell may have a small linewidth and is narrow and large in height so as to increase a sunlight receiving area. However, a general printing mask has a limit in increasing electrode aspect ratio (height/linewidth), and thus allows limited improvement in solar cell conversion efficiency.

Recently, attempts have been made to improve the aspect ratio of a finger electrode using a printing mask having an opening rate of 65% or more. However, when a conductive paste composition generally used in a general printing mask having a low opening rate is applied to a printing mask having a high opening rate, there is a problem in that line width is likely to be increased during baking, causing insignificant enhancement in the aspect ratio or deterioration in electrical properties.

Therefore, a method of manufacturing a solar cell electrode that can suppress increase of line width during baking and deterioration of electrical characteristics while using a printing mask having a high opening rate of 65% or more is desirable.

SUMMARY

Embodiments are directed to a method of manufacturing a finger electrode for a solar cell, the method including printing a conductive paste on a front surface of a substrate using a printing mask having an opening rate of about 65% or more and baking the printed conductive paste. The conductive paste includes a conductive powder, a glass frit including about 30 mol % to about 60 mol % of tellurium oxide and about 0.1 mol % to about 10 mol % of tungsten oxide, and an organic vehicle.

The printing mask may have an opening rate of about 65% to about 90%.

The printing mask may include a mesh, a photosensitive resin layer integrated with the mesh, and an electrode printing portion formed by removing the photosensitive resin layer.

The mesh may include weft threads. A distance between weft threads of the mesh above and below the electrode printing portion may be greater than a distance between weft threads of the mesh in other regions.

Baking of the conductive paste may be performed at about 600° C. to about 1,000° C.

The glass frit may further include at least one of lead (Pb) and bismuth (Bi) and at least one selected from lithium (Li), zinc (Zn), and magnesium (Mg) oxides.

The conductive paste may include about 60 wt % to about 95 wt % of the conductive powder, about 0.5 wt % to about 20 wt % of the glass frit, and about 1 wt % to about 30 wt % of the organic vehicle.

The conductive paste may further include at least one additive selected from a dispersant, a thixotropic agent, a plasticizer, a viscosity stabilizer, an anti-foaming agent, a pigment, a UV stabilizer, an antioxidant, and a coupling agent.

Embodiments are also directed to a finger electrode for a solar cell manufactured by the method of manufacturing a finger electrode for solar cells as described herein.

BRIEF DESCRIPTION OF DRAWINGS

Features will become apparent to those of skill in the art by describing in detail exemplary embodiments with reference to the attached drawings in which.

DETAILED DESCRIPTION

Figure 1:
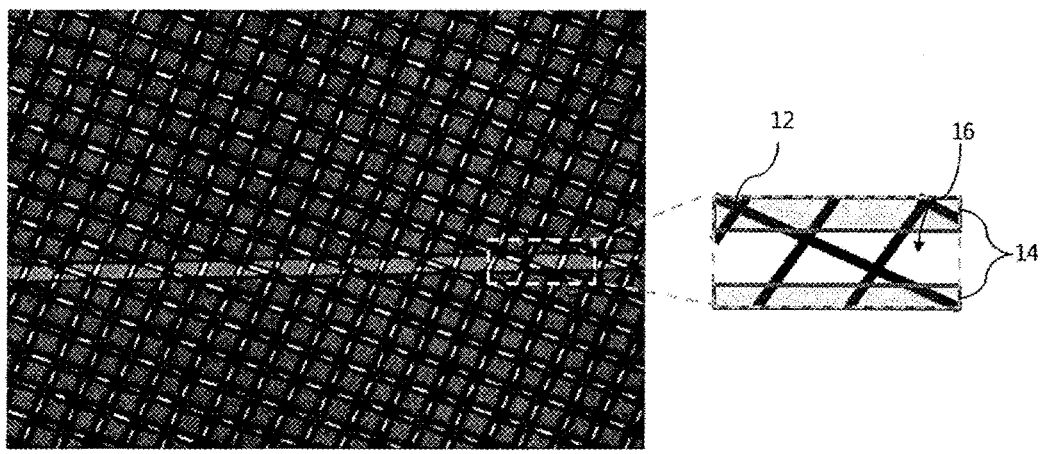
FIG. 1 illustrates a view of a general printing mask used in the formation of a finger electrode for a solar cell.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration.

A method for manufacturing a finger electrode for solar cells according to embodiments includes: (a) printing a conductive paste on a front surface of a substrate using a printing mask having an opening rate of about 65% or more; and (b) baking the printed conductive paste.

Figure 2:
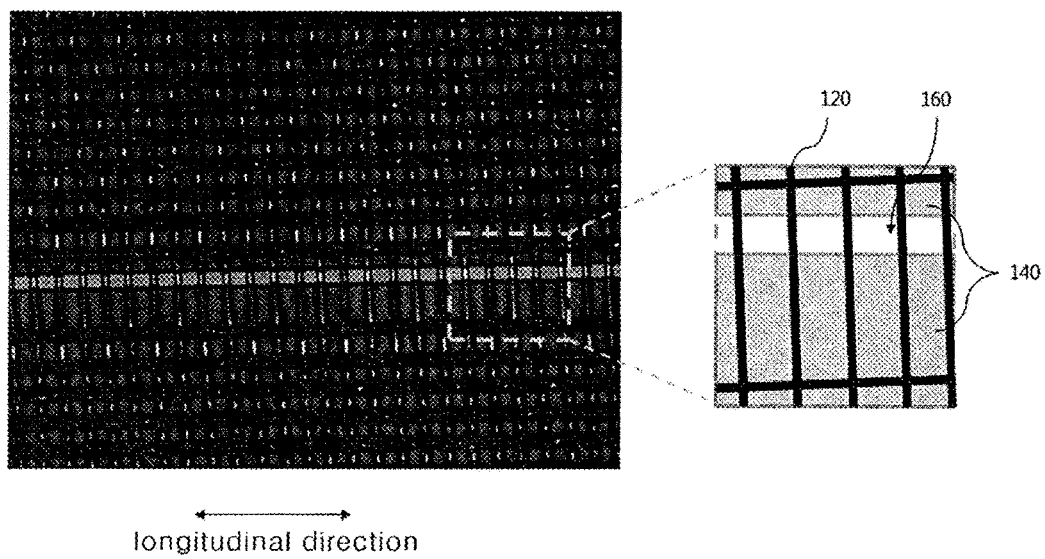
FIG. 2 illustrates a view of a printing mask having high opening rate according to embodiments.

A printing mask according to embodiments is described herein. FIG. 2 shows an example of the printing mask 100 according to embodiments. Referring to FIG. 2, the printing mask 100 may include a mesh 120, a photosensitive resin layer 140 integrated with the mesh 120, and an electrode printing portion 160 formed by removing the photosensitive resin layer. The printing mask 100 may have an opening rate of about 65% or more, or, for example, about 65% to about 90%. For example, the printing mask 100 may have an opening rate of about 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, or 90%. The opening rate is calculated according to Equation 1:

Opening rate (%)={(Area of electrode printing portion−Area occupied by mesh in electrode printing portion)/Area of electrode printing portion}×100.   [Equation 1]

When the finger electrode is formed using the printing mask 100 including the electrode printing portion having a high opening rate, the amount of conductive paste printed on the substrate is increased for a given area, thereby increasing the aspect ratio of the electrode.

In the printing mask 100, warp threads of the mesh may be arranged at an angle of about 80° to about 105°, or, for example, about 85° to about 105° with respect to the longitudinal direction of the printing mask. When the angle of the warp threads of the mesh falls within the above range, the area occupied by the mesh in the electrode printing portion may be minimized, thereby obtaining a high opening rate. For example, warp threads of the mesh may be at an angle of about 80°, 81°, 82°, 83°, 84°, 85°, 86°, 87°, 88°, 89°, 90°, 91°, 92°, 93°, 94°, 95°, 96°, 97°, 98°, 99°, 100°, 101°, 102°, 103°, 104° or 105° with respect to the longitudinal direction of the printing mask.

In addition, as shown in FIG. 2, the distance between weft threads of the mesh above and below the electrode printing portion 160 may be longer than the distance between weft threads of the mesh in other regions. Herein, the terms "above" and "below" may be understood with reference to FIG. 2, wherein "above" refers to a location between the electrode printing portion 100 and the top of the drawing, and "below" refers to a location between the electrode printing portion 100 and a bottom of the drawing.

When the distance between the weft threads of the mesh adjacent the electrode printing portion is relatively long, the area occupied by the mesh in the electrode printing portion 160 may be minimized while preventing a reduction in printability that could be caused by tension that may be applied to the printing mask by a pressing device during printing of the conductive paste.

Next, the conductive paste according to embodiments will be described. The conductive paste may include a conductive powder, a glass fit, and an organic vehicle.

(1) Conductive Powder

The conductive powder may include a suitable conductive powder for use in solar cell electrodes. For example, the conductive powder may be or include silver, aluminum, nickel, copper, or a combination thereof. For example, silver powder may be used as the conductive powder. The conductive powder may have a nanometer or micrometer-scale particle size. For example, the conductive powder may have a particle size of dozens to several hundred nanometers, or a particle diameter of several to dozens of micrometers. In some implementations, the conductive powder may be a mixture of two or more types of conductive powders having different particle sizes.

The conductive powder may have a suitable particle shape such as a spherical, flake or amorphous particle shape.

The conductive powder has an average particle diameter (D50) of, for example, about 0.1 μm to about 10 μm, or, for example, about 0.5 μm to about 5 μm. Within this range of average particle diameter, the conductive paste may reduce contact resistance and line resistance of a solar cell. The average particle diameter may be measured using, for example, a Model 1064D particle size analyzer (CILAS Co., Ltd.) after dispersing the conductive powder in isopropyl alcohol (IPA) at 25° C. for 3 minutes via ultrasonication.

The conductive powder may be present in an amount of about 60 wt % to about 95 wt % based on the total weight of the conductive paste. Within this range, the conductive paste may improve conversion efficiency of a solar cell and may be easily prepared in paste form. The conductive powder is present in an amount of, for example, about 70 wt % to about 90 wt % based on the total weight of the conductive paste. For example, the conductive powder may be present in an amount of about 60 wt %, 61 wt %, 62 wt %, 63 wt %, 64 wt %, 65 wt %, 66 wt %, 67 wt %, 68 wt %, 69 wt %, 70 wt %, 71 wt %, 72 wt %, 73 wt %, 74 wt %, 75 wt %, 76 wt %, 77 wt %, 78 wt %, 79 wt %, 80 wt %, 81 wt %, 82 wt %, 83 wt %, 84 wt %, 85 wt %, 86 wt %, 87 wt %, 88 wt %, 89 wt %, 90 wt %, 91 wt %, 92 wt %, 93 wt %, 94 wt %, or 95 wt % based on the total weight of the conductive paste.

(2) Glass Frit

The glass frit may serve to form silver crystal grains in an emitter region by etching an anti-reflection layer and melting the conductive powder during a baking process of the electrode paste. Further, the glass frit may improve adhesion of the conductive powder to a wafer and may become softened to decrease the baking temperature during the baking process.

When the sheet resistance of a solar cell is increased in order to improve solar cell efficiency, there is a possibility that contact resistance and current leakage may also increase in the solar cell. Thus, it is desirable to minimize both serial resistance (Rs) and influence on a p-n junction while maximizing open circuit voltage. In addition, the baking temperatures may vary within a broad range with increasing use of various wafers having different sheet resistances. Accordingly, it is desirable that the glass frit secure sufficient thermal stability to withstand a wide range of baking temperatures.

The glass frit according to embodiment may include about 30 mol % to about 60 mol % of tellurium oxide and about 0.1 mol % to about 10 mol % of tungsten oxide. Tellurium oxide may be present in an amount of, for example, about 30 mol % to about 55 mol % and tungsten oxide may be present in an amount of, for example, about 1 mol % to about 7 mol % in the glass fit. When the amounts of tellurium and tungsten fall within these ranges, it may be possible to effectively suppress an increase in electrode line width during baking while avoiding or minimizing deterioration in electrical characteristics.

The glass fit may further include a metal and/or a metal oxide in addition to tellurium (Te) and tungsten (W). For example, the glass frit may further include at least one selected from the group consisting of bismuth (Bi), lithium (Li), boron (B), zinc (Zn), lead (Pb), phosphorus (P), germanium (Ge), gallium (Ga), cerium (Ce), iron (Fe), silicon (Si), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), and oxides thereof.

As an example, the glass fit may further include at least one of lead (Pb) and bismuth (Bi), lithium (Li), zinc (Zn), and magnesium (Mg).

For example, the glass frit may include: at least one of lead (Pb) and bismuth (Bi) and at least one selected from lithium (Li), zinc (Zn), and magnesium (Mg) oxides.

The glass frit may be prepared from such metal oxides by a suitable method known in the art. For example, the metal oxides may be mixed in a predetermined ratio. Mixing may be carried out using a ball mill or a planetary mill. The mixture may then be melted at about 900° C. to about 1,300° C., followed by quenching to 25° C. The resulting material may be subjected to pulverization using a disk mill, a planetary mill, or the like, thereby preparing a glass frit.

The glass frit may have an average particle diameter (D50) of about 0.1 μm to about 10 μm, and may have a spherical or amorphous shape.

The glass frit may be present in the conductive paste in an amount of about 0.5 wt % to about 20 wt %, or, for example, about 0.5 wt % to about 3.5 wt %, based on the total weight of the conductive paste. Within this range, the glass frit may provide stability of a p-n junction under various sheet resistances, minimize serial resistance, and ultimately improve solar cell efficiency. The glass frit may be present in an amount of, for example, about 0.5 wt %, 1 wt %, 1.5 wt %, 2 wt %, 2.5 wt %, 3 wt %, 3.5 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, or 20 wt % based on the total weight of the conductive paste.

(3) Organic Vehicle

The organic vehicle may impart suitable viscosity and rheological characteristics for printing to the conductive paste. The organic vehicle may be mechanical mixed with the inorganic component of the composition.

The organic vehicle may be a suitable organic vehicle used in a conductive paste for solar cell electrodes. The organic vehicle may include a binder resin, a solvent, or the like.

The binder resin may be selected from acrylate resins or cellulose resins. For example, ethyl cellulose may be used as the binder resin. The binder resin may be selected from, for example, ethyl hydroxyethyl cellulose, nitrocellulose, blends of ethyl cellulose and phenol resins, alkyd resins, phenol resins, acrylate ester resins, xylene resins, polybutane resins, polyester resins, urea resins, melamine resins, vinyl acetate resins, wood rosin, polymethacrylates of alcohols, and the like.

The solvent may be selected from, for example, hexane, toluene, ethyl cellosolve, cyclohexanone, butyl cellosolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzyl alcohol, γ-butyrolactone, and ethyl lactate. These may be used alone or as a mixture thereof.

The organic vehicle may be present in an amount of about 1 wt % to about 30 wt % based on the total weight of the conductive paste. Within this range, the organic vehicle can provide sufficient adhesive strength and excellent printability to the composition. The organic vehicle may be present in an amount of, for example, about 1 wt %, 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, or 30 wt % based on the total weight of the conductive paste.

(4) Additives

The conductive paste may further include additives to enhance fluidity and process properties and stability, as desired. The additives may include dispersants, thixotropic agents, plasticizers, viscosity stabilizers, anti-foaming agents, pigments, UV stabilizers, antioxidants, coupling agents, or the like. These additives may be used alone or as mixtures thereof. The additives may be present in an amount of about 0.1 wt % to about 5 wt % based on the total weight of the conductive paste. The content of the additives may be varied, as desired.

Printing the conductive paste may be performed through a procedure in which, after the printing mask having an opening rate of about 65% or more is disposed on the front surface of the substrate and the conductive paste is disposed on the printing mask, a pressing device such as a squeegee or a roller is moved on the conductive paste such that the conductive paste is printed onto the front surface of the substrate through openings of the printing mask.

Then, the conductive paste may be subjected to drying at about 150° C. to about 400° C., or, for example, about 200° C. to about 400° C. The drying may be performed in an IR drying furnace. The drying may be performed for about 10 seconds to about 120 seconds, as an example.

Then, the printed conductive paste may be subjected to baking, thereby forming a finger electrode. The baking may be performed at about 600° C. to about 1,000° C. for about 10 seconds to about 120 seconds.

The finger electrode for solar cells manufactured by the method may have a small line width of about 100 μm or less, or, for example, about 40 μm to 80 about μm, or, for example, about 20 μm to about 60 μm. Thus the light receiving area of a solar cell may be maximized, thereby providing excellent solar cell conversion efficiency.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Preparation Example 1

0.5 parts by weight of a binder resin (STD4, Dow Chemical Company) was sufficiently dissolved in 6.65 parts by weight of Texanol at 60° C., and 89.1 parts by weight of spherical silver powder (AG-4-8F, Dowa Hightech Co., Ltd.) having an average particle diameter of 2.0 μm, 3.2 parts by weight of glass frit I shown in Table 1, 0.1 parts by weight of a dispersant (TEGO Dispers 656, Evonik Industries), and 0.45 parts by weight of a thixotropic agent (Thixatrol ST, Elementis Co., Ltd.) were added to the binder solution, followed by mixing and kneading in a 3-roll kneader, thereby preparing a conductive paste for solar cell electrodes.

Preparation Example 2

A conductive paste for solar cell electrodes was prepared in the same manner as in Preparation Example 1 except that glass frit II shown in Table 1 was used instead of glass frit I.

Preparation Example 3

A conductive paste for solar cell electrodes was prepared in the same manner as in Preparation Example 1 except that glass frit III shown in Table 1 was used instead of glass frit I.

Preparation Example 4

A conductive paste for solar cell electrodes was prepared in the same manner as in Preparation Example 1 except that glass frit IV shown in Table 1 was used instead of glass frit I.

Preparation Example 5

A conductive paste for solar cell electrodes was prepared in the same manner as in Preparation Example 1 except that glass frit V shown in Table 1 was used instead of glass frit I.

Preparation Example 6

A conductive paste for solar cell electrodes was prepared in the same manner as in Preparation Example 1 except that glass frit VI shown in Table 1 was used instead of glass frit I.

Preparation Example 7

A conductive paste for solar cell electrodes was prepared in the same manner as in Preparation Example 1 except that glass frit VII shown in Table 1 was used instead of glass frit I.

Comparative Preparation Example 1

A conductive paste for solar cell electrodes was prepared in the same manner as in Preparation Example 1 except that glass frit VIII shown in Table 1 was used instead of glass frit I.

Comparative Preparation Example 2

A conductive paste for solar cell electrodes was prepared in the same manner as in Preparation Example 1 except that glass frit IX shown in Table 1 was used instead of glass frit I.

Comparative Preparation Example 3

A conductive paste for solar cell electrodes was prepared in the same manner as in Preparation Example 1 except that glass frit X shown in Table 1 was used instead of glass frit I.

Comparative Preparation Example 4

A conductive paste for solar cell electrodes was prepared in the same manner as in Preparation Example 1 except that glass frit XI shown in Table 1 was used instead of glass frit I.

TABLE 1

| Glass frit # (unit: mol %) | $Bi_2O_3$ | $TeO_2$ | $WO_3$ | $Li_2O$ | ZnO | MgO | $B_2O_3$ |
|---|---|---|---|---|---|---|---|
| I | 6 | 30 | 10 | 18 | 17.5 | 13.5 | 5 |
| II | 5 | 43 | 7 | 16 | 15 | 12.5 | 1.5 |
| III | 5 | 50 | 3 | 17 | 15 | 10 | — |
| IV | 5 | 55 | 3 | 15.5 | 15 | 6.5 | — |
| V | 5 | 55 | 0.1 | 15.4 | 13 | 11.5 | — |
| VI | 5 | 55 | 1 | 15 | 13 | 11 | — |
| VII | 5 | 55 | 5 | 15 | 11 | 9 | — |
| VIII | 6.5 | 25 | 10 | 20.5 | 18.5 | 14.5 | 5 |
| IX | 2 | 55 | 12.5 | 15.5 | 8 | 7 | — |
| X | 4 | 65 | 5 | 13 | 6 | 7 | — |
| XI | 4 | 60 | — | 18 | 12.24 | 5.76 | — |

Example 1

A printing mask having an opening rate of 82% and including an electrode printing portion having a line width of 26 μm (Sanli Precision Ind.) was placed on a semiconductor substrate. The conductive paste prepared in Preparation Example 1 was placed on the printing mask and printed using a squeegee, followed by drying in an IR drying furnace. Then, an aluminum paste was printed on a back surface of the semiconductor substrate and dried in the same manner as above. Cells formed according to this procedure were subjected to baking at 950° C. for 45 seconds in a belt-type baking furnace, thereby fabricating a solar cell.

Example 2

A solar cell was manufactured in the same manner as in Example 1 except that the conductive paste prepared in Preparation Example 2 was used.

Example 3

A solar cell was manufactured in the same manner as in Example 1 except that the conductive paste prepared in Preparation Example 3 was used.

Example 4

A solar cell was manufactured in the same manner as in Example 1 except that the conductive paste prepared in Preparation Example 4 was used.

Example 5

A solar cell was manufactured in the same manner as in Example 1 except that the conductive paste prepared in Preparation Example 5 was used.

Example 6

A solar cell was manufactured in the same manner as in Example 1 except that the conductive paste prepared in Preparation Example 6 was used.

Example 7

A solar cell was manufactured in the same manner as in Example 1 except that the conductive paste prepared in Preparation Example 7 was used.

Comparative Example 1

A solar cell was manufactured in the same manner as in Example 1 except that the conductive paste prepared in Comparative Preparation Example 1 was used.

Comparative Example 2

A solar cell was manufactured in the same manner as in Example 1 except that the conductive paste prepared in Comparative Preparation Example 2 was used.

Comparative Example 3

A solar cell was manufactured in the same manner as in Example 1 except that the conductive paste prepared in Comparative Preparation Example 3 was used.

Comparative Example 4

A solar cell was manufactured in the same manner as in Example 1 except that the conductive paste prepared in Comparative Preparation Example 4 was used.

Comparative Example 5

A solar cell was manufactured in the same manner as in Example 1 except that a printing mask having an opening rate of 63% and including an electrode printing portion having a line width of 37 μm (Lebon Screen Printing Equipment) was used.

Property Evaluation (1) Linewidth: Electrode linewidth was measured using a confocal microscope (VK-9700, Keyence Corp.).

(2) Electrical properties: Each of the solar cells manufactured in Examples 1 to 7 and Comparative Examples 1 to 5 was evaluated as to short circuit current (Isc), open-circuit voltage (Voc), contact resistance (Rs), Fill Factor (FF, %), and conversion efficiency (Eff.) using a solar cell efficiency tester (CT-801, Pasan Co., Ltd.). Results are shown in Table 2.

TABLE 2

| Item | Linewidth (μm) | Isc (A) | Voc (mV) | Rs (mΩ) | FF (%) | Eff. (%) |
|---|---|---|---|---|---|---|
| Example 1 | 52.1 | 8.680 | 630.0 | 2.74 | 77.86 | 17.52 |
| Example 2 | 55.5 | 8.796 | 630.0 | 2.61 | 77.88 | 17.76 |
| Example 3 | 59.0 | 8.798 | 630.2 | 2.28 | 78.33 | 17.87 |
| Example 4 | 61.3 | 8.766 | 630.3 | 2.25 | 78.42 | 17.83 |
| Example 5 | 59.8 | 8.768 | 630.0 | 2.42 | 78.32 | 17.80 |
| Example 6 | 60.7 | 8.727 | 630.3 | 2.12 | 78.58 | 17.79 |
| Example 7 | 61.6 | 8.688 | 630.5 | 2.52 | 78.63 | 17.73 |
| Comparative Example 1 | 51.1 | 8.141 | 629.7 | 3.06 | 77.67 | 16.39 |
| Comparative Example 2 | 67.4 | 8.481 | 629.8 | 2.75 | 77.71 | 17.08 |
| Comparative Example 3 | 67.7 | 8.366 | 630.3 | 2.43 | 78.02 | 16.93 |
| Comparative Example 4 | 68.2 | 8.342 | 628.7 | 2.11 | 77.98 | 16.83 |
| Comparative Example 5 | 70.4 | 8.087 | 629.8 | 2.69 | 77.68 | 16.28 |

In Table 2, it can be seen that the solar cell electrodes of Examples 1 to 7 manufactured using the printing mask having an opening rate according to embodiments and the glass fit including tellurium oxide and tungsten oxide in specific amounts provided higher conversion efficiency than the solar cell electrodes of Comparative Examples 1 to 5 using a general glass frit or using a printing mask having an opening rate outside the range as described herein.

By way of summation and review, it is desirable that a finger electrode formed on a front surface of a solar cell have a small linewidth and be narrow with a large height so as to increase a sunlight receiving area. However, a general printing mask has a limit in increasing electrode aspect ratio (height/linewidth), and thus provides only limited improvement in solar cell conversion efficiency.

Recently, attempts have been made to improve the aspect ratio of a finger electrode using a printing mask having an opening rate of 65% or more. However, when a conductive paste composition generally used in a printing mask having a low opening rate is applied to a printing mask having a high opening rate, the line width may increase during baking, such that only insignificant enhancement in the aspect ratio are achieved or causing a deterioration in electrical properties.

Therefore, a method of manufacturing a solar cell electrode which can suppress increase of line width during baking and deterioration of electrical characteristics while using a printing mask having a high opening rate of 65% or more is desirable.

Embodiments provide a finger electrode for solar cells that is manufactured by the method as set forth herein and has a high aspect ratio and excellent electrical characteristics, thereby providing excellent conversion efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A method of manufacturing a finger electrode for a solar cell, the method comprising:
    (a) printing a conductive paste on a front surface of a substrate using a printing mask having an opening rate of about 65% or more, the printing mask including a mesh, a photosensitive resin layer integrated with the mesh, and an electrode printing portion formed by removing the photosensitive resin layer; and (b) baking the printed conductive paste, wherein the conductive paste includes a conductive powder, a glass frit including about 30 mol % to about 60 mol % of tellurium oxide and about 0.1 mol % to about 10 mol % of tungsten oxide, and an organic vehicle.

2. The method as claimed in claim 1, wherein the printing mask has an opening rate of about 65% to about 90%.

3. The method as claimed in claim 1, wherein:

the mesh includes weft threads, and a distance between weft threads of the mesh above and below the electrode printing portion is greater than a distance between weft threads of the mesh in other regions.

4. The method as claimed in claim 1, wherein baking of the conductive paste is performed at about 600° C. to about 1,000° C.

5. The method as claimed in claim 1, wherein the glass frit further includes at least one of lead (Pb) and bismuth (Bi) and at least one selected from lithium (Li), zinc (Zn), and magnesium (Mg) oxides.

6. The method as claimed in claim 1, wherein the conductive paste includes about 60 wt % to about 95 wt % of the conductive powder, about 0.5 wt % to about 20 wt % of the glass frit, and about 1 wt % to about 30 wt % of the organic vehicle.

7. The method as claimed in claim 1, wherein the conductive paste further includes at least one additive selected from a dispersant, a thixotropic agent, a plasticizer, a viscosity stabilizer, an anti-foaming agent, a pigment, a UV stabilizer, an antioxidant, and a coupling agent.

8. A finger electrode for a solar cell manufactured by the method of manufacturing a finger electrode for solar cells as claimed in claim 1.

9. A solar cell including the finger electrode as claimed in claim 8.

* * * * *